United States Patent
Kanehara et al.

(10) Patent No.: US 7,023,722 B2
(45) Date of Patent: Apr. 4, 2006

(54) LOW-OPERATING VOLTAGE AND LOW POWER CONSUMPTION SEMICONDUCTOR MEMORY DEVICE

(75) Inventors: Hidenari Kanehara, Osaka (JP); Hiroaki Okuyama, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 157 days.

(21) Appl. No.: 10/737,799

(22) Filed: Dec. 18, 2003

(65) Prior Publication Data

US 2004/0130933 A1    Jul. 8, 2004

(30) Foreign Application Priority Data

Dec. 20, 2002    (JP) ............... 2002-370011

(51) Int. Cl.
*G11C 11/00*    (2006.01)

(52) U.S. Cl. ............ 365/154; 365/230.06; 365/189.11; 365/156; 365/189.09; 365/205

(58) Field of Classification Search ................ 365/154, 365/230.06, 189.11, 156, 189.09, 205
See application file for complete search history.

(56) References Cited

U.S. PATENT DOCUMENTS 5,276,652 A    1/1994    Anami

| 5,715,191 A | * | 2/1998 | Yamauchi et al. .......... 365/156 |
| 5,898,610 A | | 4/1999 | Greason |
| 6,798,688 B1 | * | 9/2004 | Joshi .......................... 365/154 |
| 6,862,207 B1 | * | 3/2005 | Wei et al. .................... 365/154 |

FOREIGN PATENT DOCUMENTS

JP    8-180684    7/1996

OTHER PUBLICATIONS

T. Douseki et al., "Static-Noise Margin Analysis for a Scaled-Down CMOS Memory Cell", Institute of Electronics Information and Communication Engineers, C-ll vol. J75-C-II No. 7 pp. 350-381, Jul. 1992.

* cited by examiner

*Primary Examiner*—Connie C. Yona
(74) *Attorney, Agent, or Firm*—McDermott Will & Emery LLP

(57) ABSTRACT

The respective sources of drive transistors included in memory cells that are located in each of multiple columns and connected to a corresponding one of bit line pairs are connected commonly to a low voltage power supply VSS via an assertion transistor. When data is written, the assertion transistor for the memory cells connected to a selected one of the bit line pairs and located in the identical column is negated, so that the sources of the drive transistors in the memory cells in that column are allowed to float. Consequently, even with a low power supply voltage, it is possible to write the data into a single selected memory cell, while data in the unselected memory cells can be retained favorably.

7 Claims, 8 Drawing Sheets

LOW-OPERATING VOLTAGE AND LOW POWER CONSUMPTION SEMICONDUCTOR MEMORY DEVICE

BACKGROUND OF THE INVENTION

The present invention relates to lowering the operating voltage of, and lowering the power consumption by, semiconductor memory devices.

FIG. 6 illustrates a known SRAM circuit. The SRAM includes a number of memory cells 1A through 1D disposed in a memory array. Since those memory cells have the same configuration, the memory cell 1A will be described as an example. The memory cell 1A is composed of two load transistors MP1A and MP2A, two transfer transistors MN1A and MN2A, and two drive transistors MN3A and MN4A. The gates of the two transfer transistors MN1A and MN2A are coupled to a word line WLn, while the drains thereof are coupled to bit lines BIT0 and NBIT0. The sources of the two load transistors MP1A and MP2A are coupled to a high voltage power supply VDD. The sources of the two drive transistors MN3A and MN4A are coupled to a low voltage power supply VSS. The load transistors MP1A and MP2A and the drive transistors MN3A and MN4A form two latch circuits. The respective outputs of the latch circuits are connected to the sources of the transfer transistors MN1A and MN2A.

In the SRAM illustrated in FIG. 6, the reference marks 2A and 2B denote precharge-equalize circuits, which are coupled to bit line pairs (BIT0, NBIT0) and (BIT1, NBIT1), respectively, and to which a precharge signal PR is inputted. The reference marks 3A and 3B denote column selectors, which are coupled to the bit line pairs (BIT0, NBIT0) and (BIT1, NBIT1), respectively, and to which column signals CA0 and CA1 are inputted, respectively. The reference numeral 4 indicates a data write circuit, which is connected to the column selectors 3A and 3B via a pair of busses BUS and NBUS.

Hereinafter, a data write operation performed by the SRAM will be described with reference to a timing chart shown in FIG. 7.

When data is written, one of the bit lines BIT0 and NBIT0 selected by a column selector (3A, for example) from among the bit lines BIT0, NBIT0, BIT1, and NBIT1 that have been precharged to the high voltage power supply VDD voltage by the precharge-equalize circuits 2A and 2B, is inverted to the low voltage VSS by the write circuit 4. Next, a selected word line (WLn, for example) is asserted to bring the transfer transistors MN1A and MN2A in the memory cell 1A into conduction, so that the data is written into the memory cell 1A.

To evaluate data write operations, "write margin" is used, for example, in the journal (1992 Vol.J75 C-II No. 7 pp. 350–361) published by the Institute of Electronics, Information and Communication Engineers. The write margin is defined as margin for rewriting data in a memory cell into the reverse data. As in the SRAM illustrated in FIG. 6, since the respective sources of the drive transistors MN3A through MN4D are coupled to the low voltage power supply VSS, the lower the high voltage power supply VDD, the smaller the write margin becomes.

Accordingly, in the SRAM illustrated in FIG. 6, in a case of a low voltage of the high voltage power supply VDD, the write margin becomes small, making it difficult to write the reverse data of the previously written data. Further, in the SRAM illustrated in FIG. 6, one of the bit line pair BIT0 and NBIT0 connected to the memory cell 1A, into which the data is to be written, is fully amplified from the high voltage VDD to the low voltage VSS, causing an increase in current consumption during the write operation.

In order to solve the above problems, as shown in FIG. 8, in the Japanese Laid-Open Publication No. 8-180684, for example, drive transistors (MN3A, MN4A, MN3C and MN4C) through (MN3B, MN4B, MN3D and MN4D) included in memory cells (1A, 1C) through (1B, 1D) located in the respective same rows share respective common source lines. The common source lines are controlled by source potential control signals SLn through SL0 in such a manner that during a write operation, one of the common source lines for the drive transistors is made to float so that data is written into a memory cell with the potential difference between the bit line pair being smaller than the potential difference (VDD–VSS) between the high and low voltages VDD and VSS. In this manner, a decrease in consumption power is achieved.

Nevertheless, in the conventional semiconductor memory device shown in FIG. 8, in a case where the bit line BIT0 and NBIT0 pair, e.g., is selected, if a word line WLn, e.g., is chosen, in the selected memory cell 1A, the transfer transistors MN1A and MN2A are conducting, while the source potential control signal SLn makes the sources of the drive transistors MN3A and MN4A float. Consequently, the potential difference between the bit lines BIT0 and NBIT0 is transmitted to the memory cell 1A, thereby allowing the data to be written. However, also in the unselected memory cell 1C located in the same row, the transfer transistors MN1C and MN2C are brought into conduction, while the sources of the drive transistors MN3C and MN4C float, such that data at storage nodes DC and NDC might be rewritten in the unselected memory cell 1C as well. Therefore, the multiple memory cells 1A and 1B connected to the same word line (WLn, for example) cannot be selected by the column selectors 3A and 3B.

SUMMARY OF THE INVENTION

It is therefore an object of the present invention to enable column selection of memory cells connected to the same word line, write operations at low voltage, and a decrease in current consumption in the write operations.

In order to achieve the above object, in the present invention, the sources of drive transistors included in memory cells that are connected to a selected bit line pair are made to float when data is written into one of the memory cells.

Specifically, an inventive semiconductor memory device includes a plurality of memory cells arranged in a memory array. Each of the memory cells includes: two load transistors, each of the load transistors having a source to which a first potential is supplied, and a gate which is connected to a drain of the other of the load transistors; two transfer transistors, in which each of the transfer transistors has a source, drain and gate, and the both sources or drains of the transfer transistors are connected to a pair of bit lines, while the drains or sources that are not connected to the pair of bit lines are connected to the drains of the two load transistors, and the both gates of the transfer transistors are connected to a word line; and two drive transistors, in which each of the drive transfers has a source, drain and gate, the both sources are connected together, the both drains are connected to the drains of the two load transistors, and the gate of each said drive transistor is connected to the drain of the other of said drive transistors. In the inventive semiconductor memory device, in the memory cells disposed in respective rows located in the bit line direction, the sources of the drive transistors included in the memory cells located in each row are connected to a common source line, and during a data write operation in which a bit line pair is selected, only one common source line located in a row that corresponds to the selected bit line pair is allowed to float when the one word line is asserted.

In the inventive semiconductor memory device, while the common source line for the drive transistors included in the memory cells located in one row is allowed to float, data is written into one of the memory cells with a potential difference between the two bit lines of one pair being smaller than a potential difference between the first potential and a second potential that is lower than the first potential.

In the inventive semiconductor memory device, the transfer transistors in each of the memory cells consist of N-type transistors, and the bit line pair is made to operate at a potential in the vicinity of a third potential, which is a potential between the first and second potentials.

In the inventive semiconductor memory device, the transfer transistors in each of the memory cells consist of P-type transistors, and the bit line pair is made to operate at a potential in the vicinity of the first potential.

In the inventive semiconductor memory device, the two bit lines of the pair are equalized to an identical potential by P-type transistors.

In the inventive semiconductor memory device, during the data write operation into the memory cell, the word line is asserted only for a given period of time, while the sources of the drive transistors are made to float only for that given period of time.

The inventive semiconductor memory device further includes an assertion transistor whose drain is connected to the common source line for the drive transistors included in the memory cells located in one row, and whose source is connected to the second potential. The assertion transistor is controlled to be nonconductive during the data write operation into the memory cell.

In the inventive semiconductor memory device, in a data readout operation from the memory cell, a potential supplied to the substrate of the assertion transistor is controlled to be a positive potential As described above, according to the present invention, when a given bit line pair is selected in a data write operation, the sources of the drive transistors in the memory cells connected to that selected bit line pair and located in the same direction are made to float. If a word line is selected in this situation, one of the memory cells located in that same direction is selected, so that the potential of the selected bit line pair is transmitted into the selected memory cell. Therefore, even when the power supply voltage is low, it is possible to write the data into the memory cell, irrespective of the write margin.

In the unselected ones of the memory cells that are located in the same direction, although the sources of the drive transistors are made to float, the transfer transistors are not conducting, which allows the data to be retained. Further, in a number of memory cells connected to unselected bit lines, as well as in the memory cell selected by the selected word line, the sources of the drive transistors do not float, such that their data is retained favorably.

In the present invention, in particular, the potential difference between the bit line pair does not have to be increased to the potential difference between the first and second potentials, and with the small third potential difference therebetween, the data is transmitted to the memory cell, allowing a decrease in current consumption.

Further, according to the present invention, in the case in which the transfer transistors are composed of n-type transistors, and a bit line pair is made to operate at a potential in the vicinity of the third potential between the first and second potentials, the bit lines of the pair are equalized to an identical potential by p-type transistors. This effectively prevents malfunctions during the write operation even when the potential of the bit line pair exceeds a potential VDD–Vtn (Vtn indicates the threshold voltage of the n-type transistors).

Moreover, in the present invention, when data is written, a word line is asserted for a given period of time, while the sources of the drive transistors are made to float only for that given period of time, such that data in unselected memory cells connected in the same column is prevented from being corrupted due to leakage, for example, thereby increasing the data retention characteristics.

Additionally, during a write operation in which a word line is asserted, the assertion transistor is made nonconductive, and the sources of the drive transistors in the memory cells are made to float. In this situation, when the potential of the bit line pair is transmitted to the memory cell, and the word line is then negated, the assertion transistor is brought into conduction to be connected to the second potential, and the data inside the memory cell is amplified to the first potential for retention. Accordingly, the bit line current is reduced by decreasing the potential difference between the bit line pair during the write operation.

Furthermore, in the present invention, when data is read out, the substrate potential of the assertion transistors is controlled to be a positive potential, which enables the threshold voltage of the assertion transistors to be small, increasing the readout speed.

DESCRIPTION OF THE PREFERRED EMBODIMENTS

Hereinafter, preferred embodiments of the present invention will be described with reference to the accompanying drawings.

(First Embodiment)

Figure 1:
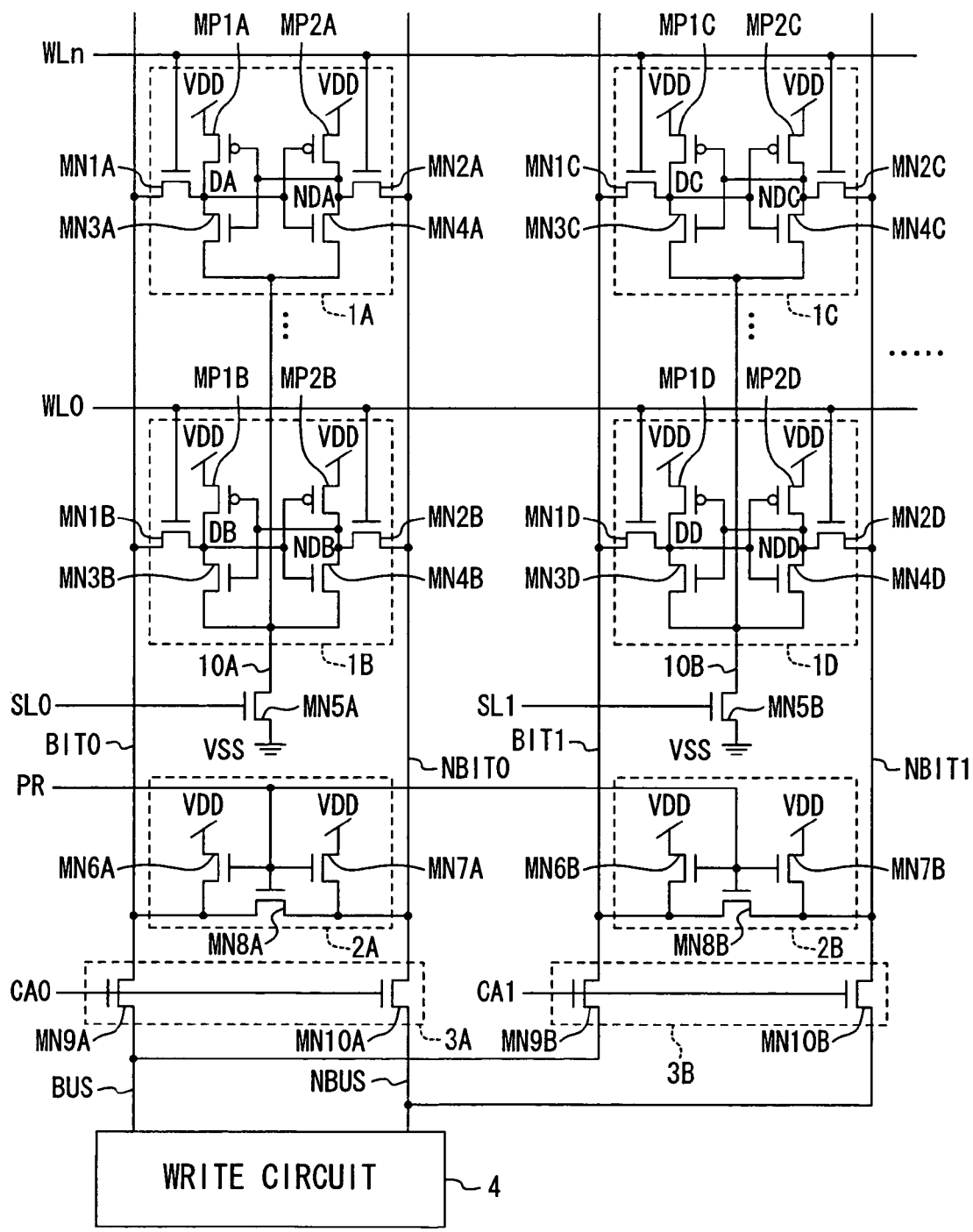
FIG. 1 illustrates a semiconductor memory device in accordance with a first embodiment of the present invention.

FIG. 1 illustrates a configuration of a semiconductor memory device in accordance with a first embodiment of the present invention.

In FIG. 1, a plurality of memory cells 1A through 1D are arranged in the form of an array. Hereinafter, the memory cell 1A will be discussed as a representative example. The other memory cells 1B through 1D, having the same internal configuration, are designated by the respective reference marks B, C and D, and the description thereof will be omitted herein.

The memory cell 1A includes two p-type load transistors MP1A and MP2A, two n-type transfer transistors MN1A and MN2A, and two n-type drive transistors MN3A and MN4A. The two load transistors MP1A and MP2A, whose sources are connected to a high voltage power supply VDD, are supplied with a high potential (a first potential). The drains of the load transistors MP1A and MP2A are connected to the sources of the two transfer transistors MN1A and MN2A and to the drains of the two drive transistors MN3A and MN4A. Each gate of the two load transistors MP1A and MP2A is connected to a respective gate of the two drive transistors MN3A and MN4A, and each is connected to the drain of the other load transistor MP1A or MP2A. The gates of the two transfer transistors MN1A and MN2A are connected to a word line WLn, while the drains thereof are connected to bit lines BIT0 and NBIT0. The gate of each of the drive transistors MN3A and MN4A is connected to the drain of the other drive transistor.

The sources of the respective two drive transistors (MN3A, MN4A) through (MN3B, MN4B) in the memory cells 1A through 1B arranged in the same column in the direction of the bit lines BIT0 and NBIT0 are connected to a common source line 10A. The common source line 10A is grounded. In addition, an assertion transistor MN5A is disposed in the common source line 10A. The drain of the assertion transistor MN5A is connected to the sources of the drive transistors (MN3A, MN4A) and (MN3B, MN4B), while the source of the assertion transistor MN5A is connected to a low voltage power supply VSS and supplied with a low voltage (a second potential). A source potential control signal SL0 is inputted into the gate of the assertion transistor MN5A. Likewise, the sources of the respective two drive transistors (MN3C, MN4C) through (MN3D, MN4D) in the memory cells 1C through 1D arranged in the same column in the direction of the bit lines BIT1 and NBIT1 are connected to a common source line 10B having an end which is grounded. An assertion transistor MN5B is disposed in the common source line 10B. A source potential control signal SL1 is inputted into the gate of the assertion transistor MN5B. The source potential control signals SL0 and SL1 are asserted correspondingly when the respective corresponding bit line pairs (BIT0, NBIT0) and (BIT1, NBIT1) are selected during a data write operation.

Further, in FIG. 1, the reference marks 2A and 2B denote precharge-equalize circuits, which correspond to the bit line pairs (BIT0, NBIT0) and (BIT1, NBIT1), respectively. The precharge-equalize circuit 2A is composed of two n-type precharge transistors (MN6A, MN7A) and an n-type equalize transistor MN8A. Likewise, the precharge-equalize circuit 2B includes two n-type precharge transistors (MN6B, MN7B) and an n-type equalize transistor MN8B. The precharge-equalize circuits 2A and 2B each receive a precharge signal PR (at H level) to interconnect and equalize the respective corresponding bit line pair, while precharging the bit line pair to a potential (a third potential) VDD−Vt, which is lower than the power supply potential VDD by a threshold voltage Vt of the n-type precharge transistors. The reference marks 3A and 3B denote column selectors, which correspond to the bit line pairs (BIT0, NBIT0) and (BIT1, NBIT1). The reference numeral 4 indicates a write circuit, which outputs data to be written. The column selectors 3A and 3B receive respective corresponding column selector selection signals CA0 and CA1 to transmit data outputted from the write circuit 4 to the corresponding bit line pairs.

Figure 2:
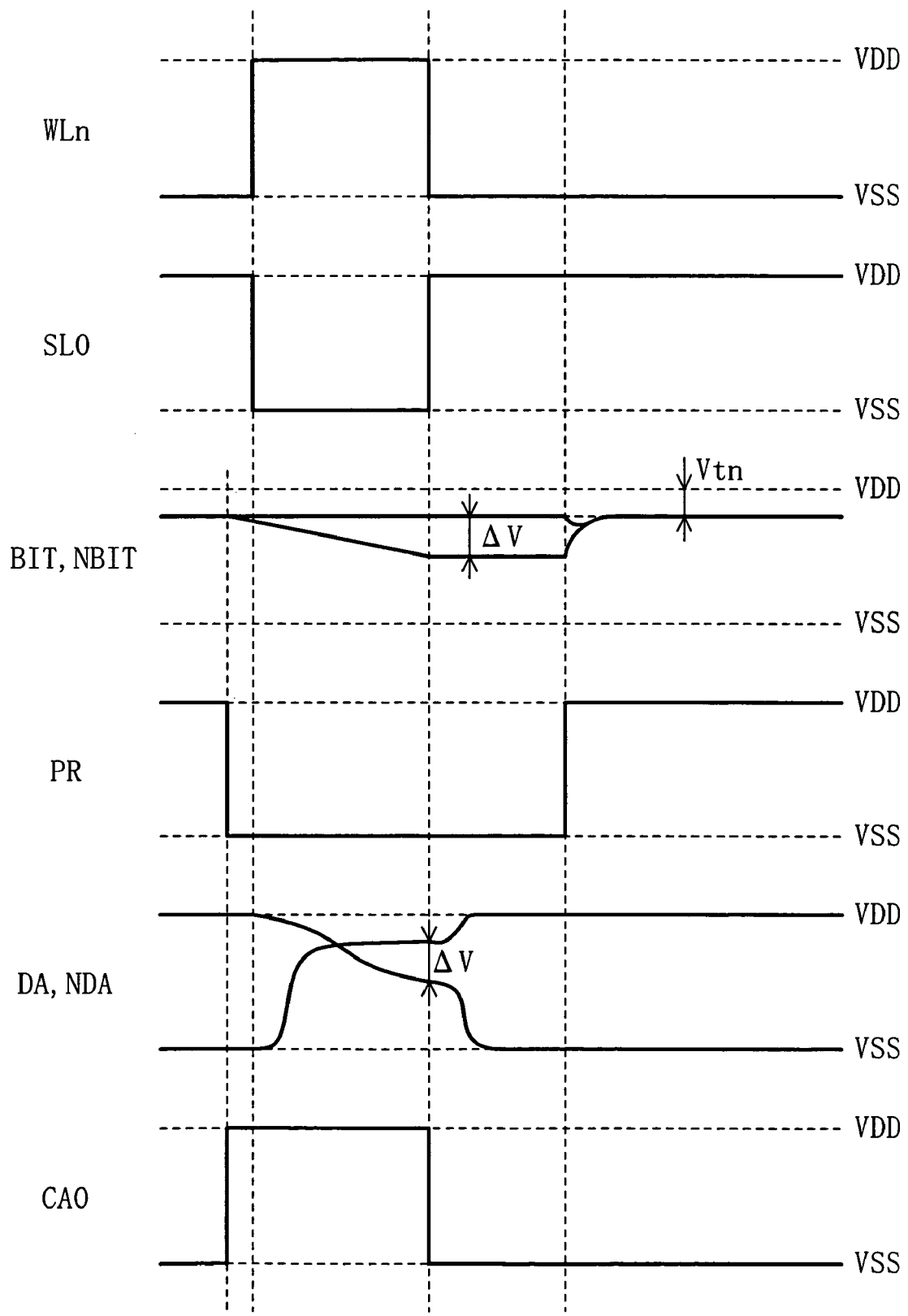
FIG. 2 illustrates a timing chart indicating a write operation performed by the semiconductor memory device.

Next, an operation according to this embodiment will be described. In this embodiment, a data write operation into the memory cell 1A will be described with reference to a timing chart shown in FIG. 2.

When data is written, the bit lines BIT0, NBIT0, BIT1 and NBIT1 have been precharged beforehand to the potential VDD−Vtn by the precharge-equalize circuits 2A and 2B. When the potential of the precharge signal PR becomes the ground potential VSS, the precharge of the bit lines BIT0, NBIT0, BIT1 and NBIT1 is cleared.

Next, the potential of the column selector selection signal CA0 becomes the power supply potential VDD, and the potential of one of the bit lines BIT0 and NBIT0 of the selected pair is lowered to a potential (VDD−Vtn−ΔV) by the write circuit 4. In this embodiment, the voltage ΔV is a very small voltage smaller than the precharge potential (VDD−Vtn), that is, the voltage ΔV is a potential smaller than the potential difference between the power supply potential VDD and the ground potential VSS.

Subsequently, the potential of the word line WLn is asserted to be the power supply potential VDD, while at the same time the potential of the source line SL0 is negated to be the ground potential VSS. At this time, the assertion of the word line WLn and the negation of the source line SL0 do not depend upon the operating frequency, and are set for a given period of time. In this situation, the assertion transistor MN5A is not conducting, such that the respective sources of the drive transistors MN3A, MN4A through MN3B, MN4B in the memory cells 1A through 1B arranged in the same column in the direction of the selected bit lines BIT0 and NBIT0 float. At this time, the potential of the source line SL1 is maintained at the power supply potential VDD. This permits the assertion transistor MN5B to be conducting, while grounding the respective sources of the drive transistors MN3C, MN4C through MN3D, MN4D in the memory cells 1C through 1D arranged in the same column in the direction of the unselected bit lines BIT1 and NBIT1. In the selected memory cell 1A, with the sources of the drive transistors MN3A and MN4A being floating, the word line WLn brings the transfer transistors MN1A and MN2A into conduction, causing the potentials (with a potential difference ΔV) of the bit lines BIT0 and NBIT0 to begin to be transferred to the storage nodes DA and NDA in the memory cell 1A.

Thereafter, when the potential difference between the storage nodes DA and NDA in the memory cell 1A becomes the very small potential ΔV, the potential of the word line WLn becomes the ground potential VSS, while the potential of the source line SL0 is raised to the power supply potential VDD. As a result, in the selected memory cell 1A, the transfer transistors MN1A and MN2A are brought out of conduction, while the assertion transistor MN5A is brought into conduction to cause the sources of the drive transistors MN3A and MN4A to have the ground potential. Consequently, the potentials of the storage nodes DA and NDA in the memory cell 1A are amplified to the power supply potential VDD and the ground potential, respectively, and the data write into the memory cell 1A is completed.

When the write operation has been completed, the potential of the precharge signal PR becomes the power supply potential VDD, and the potentials of the bit lines BIT0, NBIT0, BIT1 and NBIT1 are precharged and equalized to the potential VDD−Vtn.

As is described above, during the write operation, since the sources of the drive transistors MN3A and MN4A are allowed to float in the selected memory cell 1A, even when the power supply voltage VDD is a low voltage, it is possible to write the reverse data, irrespective of the write margin. In addition, one of the selected bit lines BIT0 and NBIT0 is amplified from the precharge potential VDD–Vtn to only the very small potential $\Delta V$, thus achieving a low power consumption as compared to a case of the full amplitude (VDD–VSS).

In the unselected memory cell 1B disposed in the same column as the selected memory cell 1A, although the sources of the drive transistors MN3B and MN4B are allowed to float, the transfer transistors MN1B and MN2B are negated, thereby permitting the data to be retained as it is. Moreover, in the unselected memory cell 1C disposed in the same row as the selected memory cell 1A, although the selected word line WLn brings the transfer transistors MN1C and MN2C into conduction, the assertion transistor MN5B is conducting so that the sources of the drive transistors MN3C and MN4C have the ground potential. This permits data at the storage nodes DC and NDC to be retained favorably. In addition, in transmitting the potential of the bit line to the selected memory cell 1A, the assertion of the word line WLn and the negation of the source line SL0 are not dependent upon the operating frequency, and are set during a given period of time. This effectively prevents data corruption caused by leakage, for example, thereby ensuring stability in the data retention.

The foregoing has described a data write operation. In a data read operation, on the other hand, a positive potential is supplied to the substrates of the assertion transistors MN5A and MN5B. This results in a decrease in the threshold voltage of the assertion transistors MN5A and MN5B, leading to enhancement of the data readout speed.

(Second Embodiment)

Hereinafter, a semiconductor memory device in accordance with a second embodiment of the present invention will be described.

Figure 3:
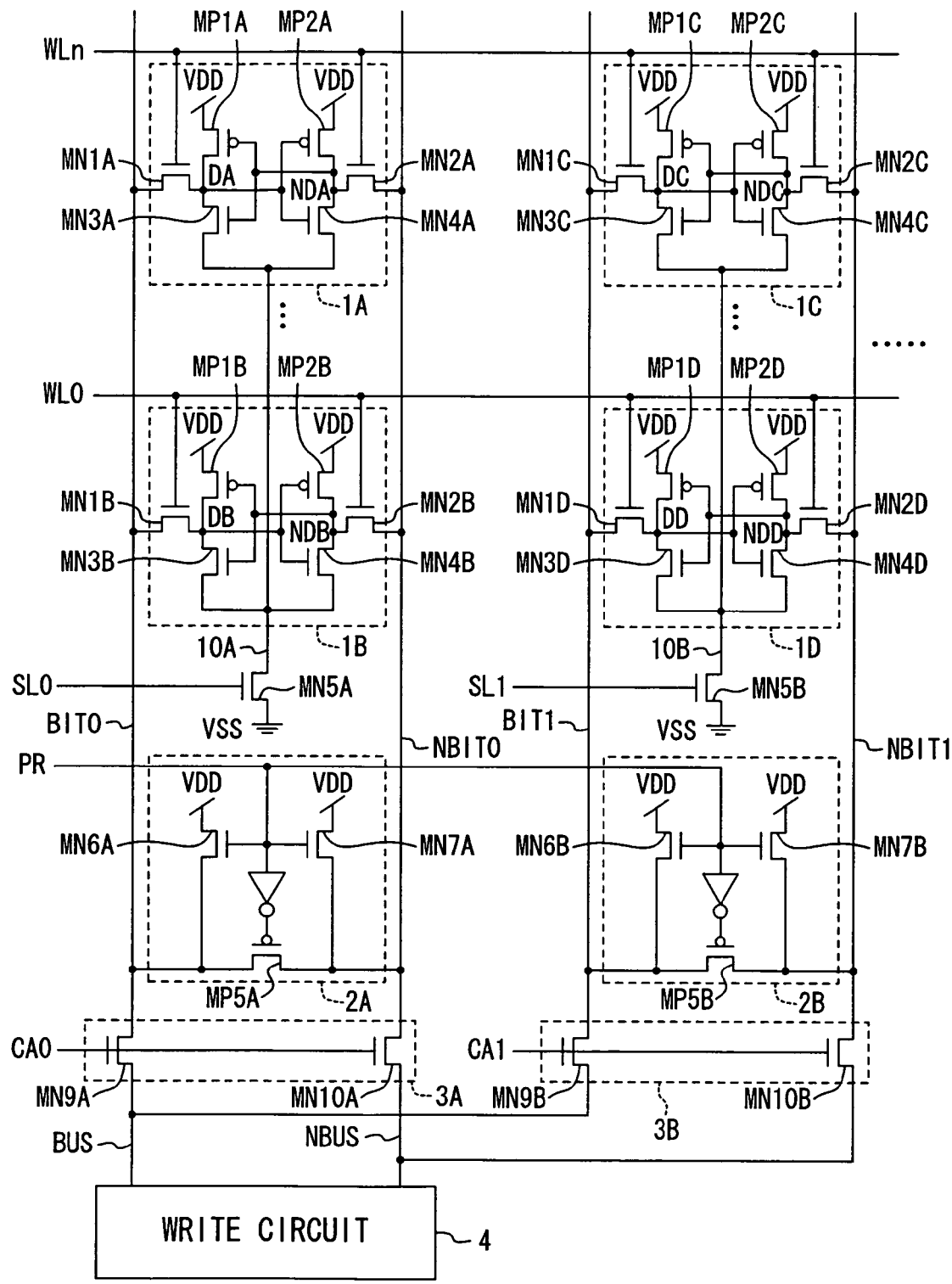
FIG. 3 illustrates a semiconductor memory device in accordance with a second embodiment of the present invention.

FIG. 3 illustrates the semiconductor memory device of this embodiment. The semiconductor memory device of FIG. 3 differs from the semiconductor memory device of FIG. 1 only in the following respect. Specifically, equalize transistors in the precharge-equalize circuits 2A and 2B are composed of p-type transistors MP5A and MP5B, and the reverse signal of the precharge signal PR is inputted into the gates of the transistors.

In this embodiment, in a data write operation, even if the potential of the bit lines BIT0, NBIT0, BIT1 and NBIT1 exceeds the precharge potential VDD–Vtn, the potential of one of selected bit lines (for example, BIT0 and NBIT0) is lowered to the ground potential VSS by the write circuit 4. As a result, data in the bit lines BIT0 and NBIT0 is transmitted into the memory cell 1A, and when the potential of one of the storage nodes DA and NDA in the memory cell 1A becomes the ground potential VSS, the load transistor MP1A or MP2A is brought into conduction, causing the other one of the storage nodes DA and NDA in the memory cell 1A to have the power supply potential VDD. And the word line WLn is negated, while at the same time the potential of the source line SL0 becomes the power supply potential VDD, which allows the data that has been written into the memory cell 1A to be retained. Accordingly, even when the power supply potential VDD is a low voltage, it is possible to write the reverse data into the memory cell 1A, irrespective of the write margin.

Further, in data read operations, it is possible to read out data in the memory cells 1A through 1D in a favorable manner, even when the potential of the bit lines BIT0, NBIT0, BIT1 and NBIT1 exceeds the potential VDD–Vtn, because the equalize transistors MP5A and MP5B in the precharge-equalize circuits 2A and 2B are composed of the p-type transistors.

(Third Embodiment)

Next, a third embodiment of the present invention will be described.

Figure 4:
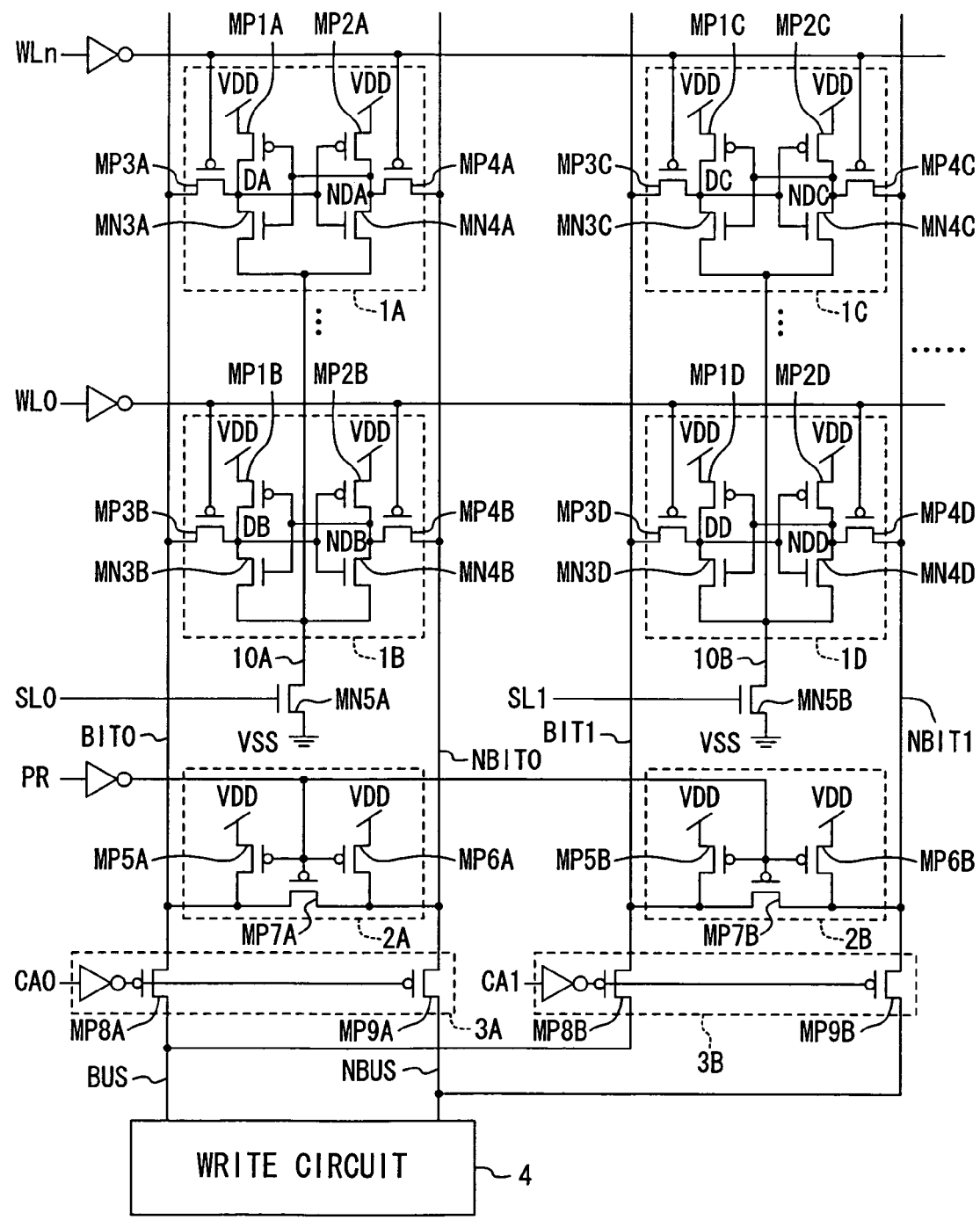
FIG. 4 illustrates a semiconductor memory device in accordance with a third embodiment of the present invention.

FIG. 4 illustrates a configuration of a semiconductor memory device of this embodiment. The semiconductor memory device of FIG. 4 differs from the semiconductor memory device of the first embodiment illustrated in FIG. 1 only in the following respect.

Specifically, in the memory cells 1A through 1D, transfer transistors are composed of p-type transistors (MP3A and MP4A), (MP3B and MP4B), (MP3C and MP4C), and (MP3D and MP4D), and the reverse signals of word line selection signals WLn through WL0 are inputted into the gates of the transfer transistors. Further, in the precharge-equalize circuits 2A and 2B, precharge transistors are composed of p-type transistors (MP5A and MP6A) and (MP5B and MP6B), and equalize transistors are also composed of p-type transistors MP7A and MP7B. The reverse signal of the precharge signal PR is inputted into the respective gates of these p-type transistors. In addition, column selectors 3A and 3B are also composed of respective two p-type transistors (MP8A, MP9A) and (MP8B, MP9B), and the reverse signals of the corresponding column selector selection signals CA0 and CA1 are inputted into the respective gates of these p-type transistors.

Figure 5:
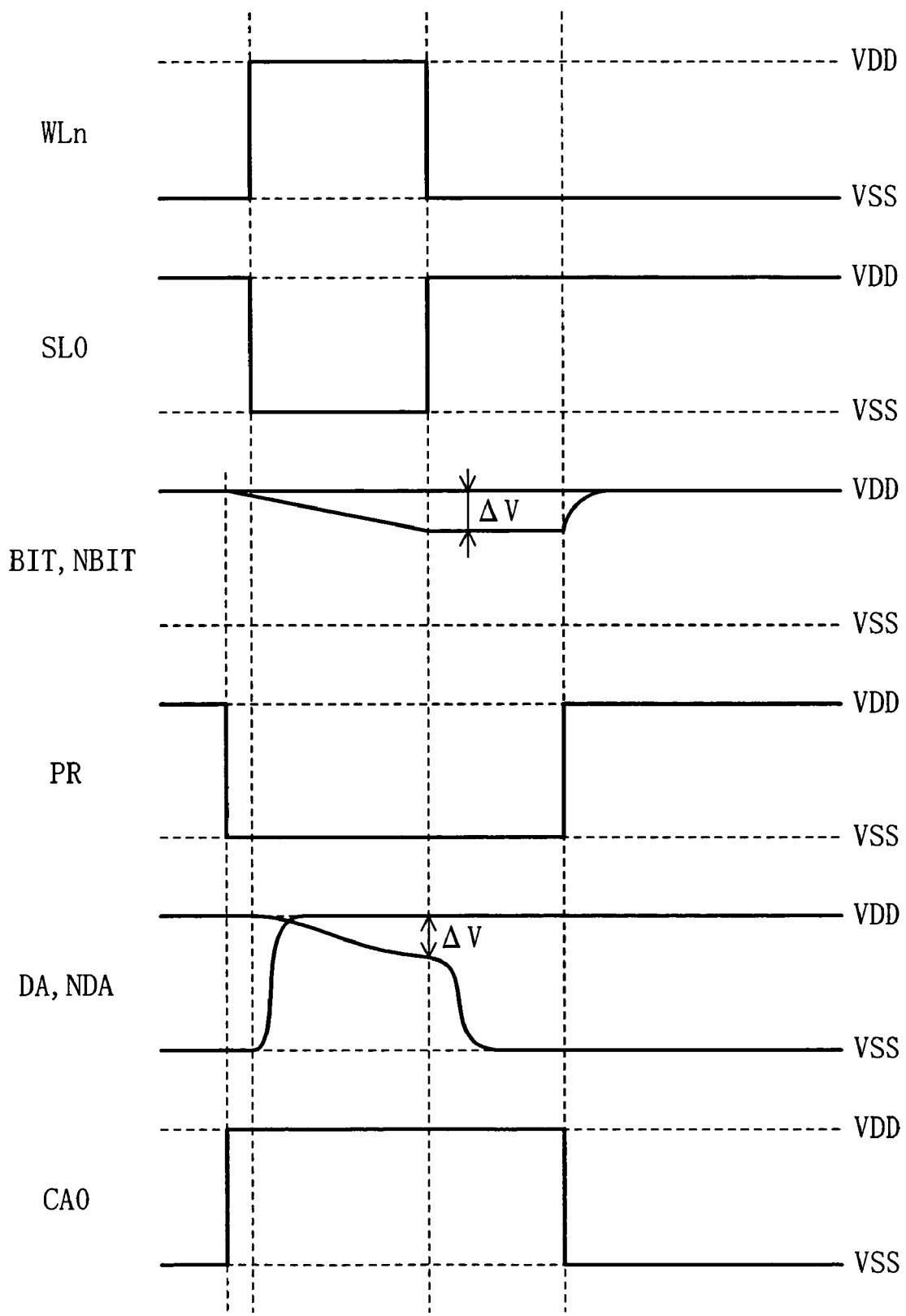
FIG. 5 illustrates a timing chart indicating a write operation performed by the semiconductor memory device.
Figure 6:
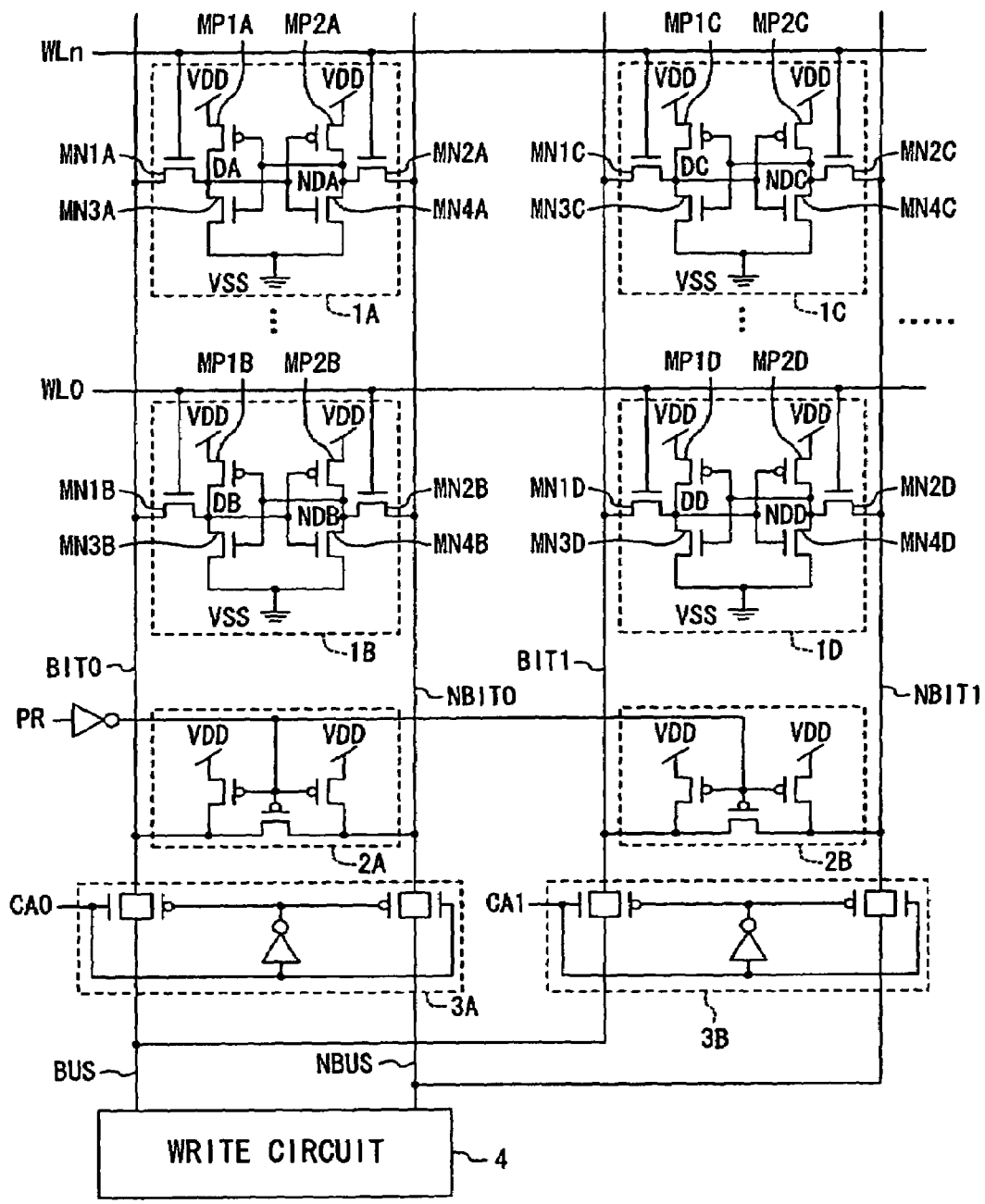
FIG. 6 illustrates a known semiconductor memory device.
Figure 7:
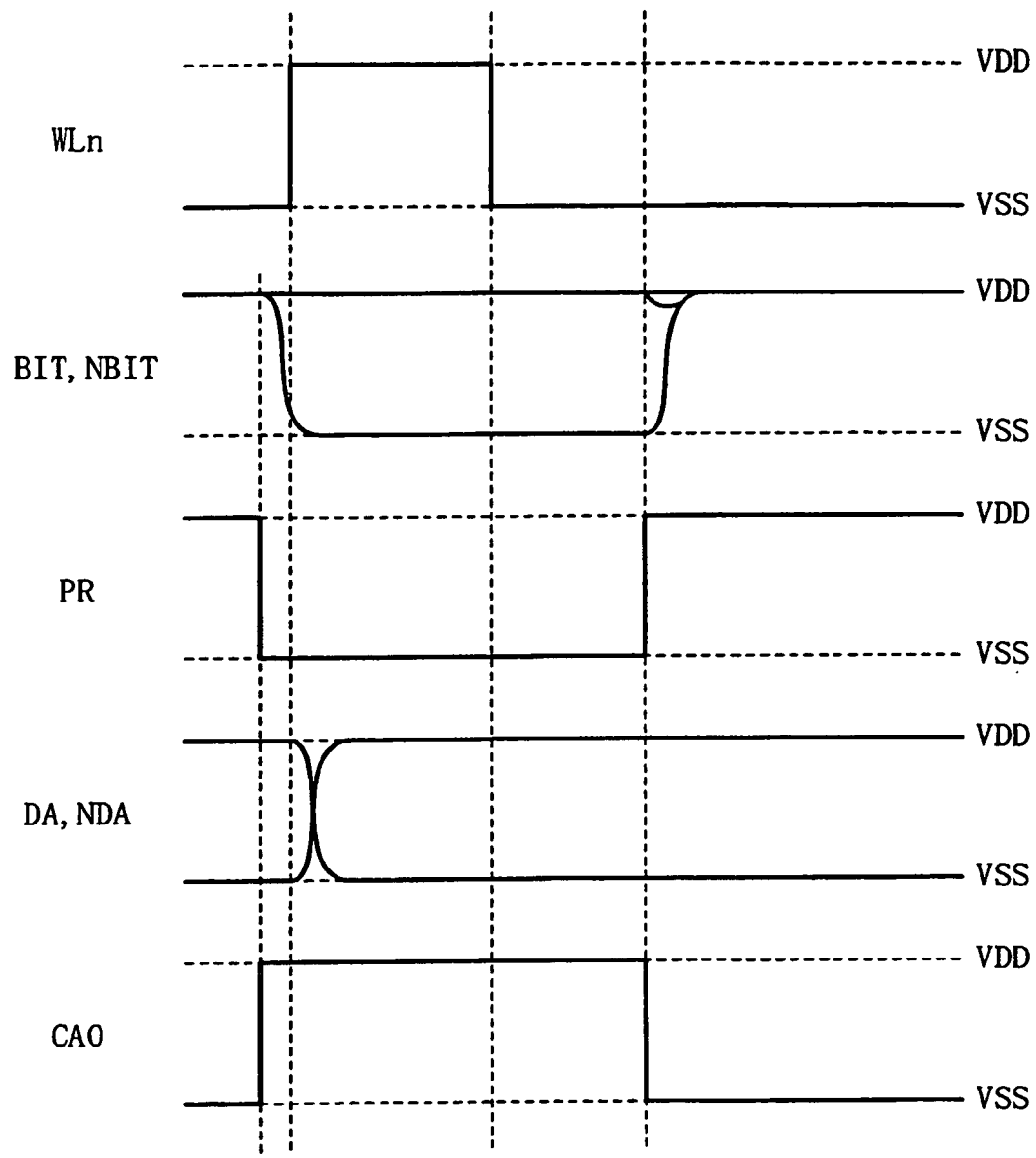
FIG. 7 illustrates a timing chart indicating a write operation performed by the semiconductor memory device.
Figure 8:
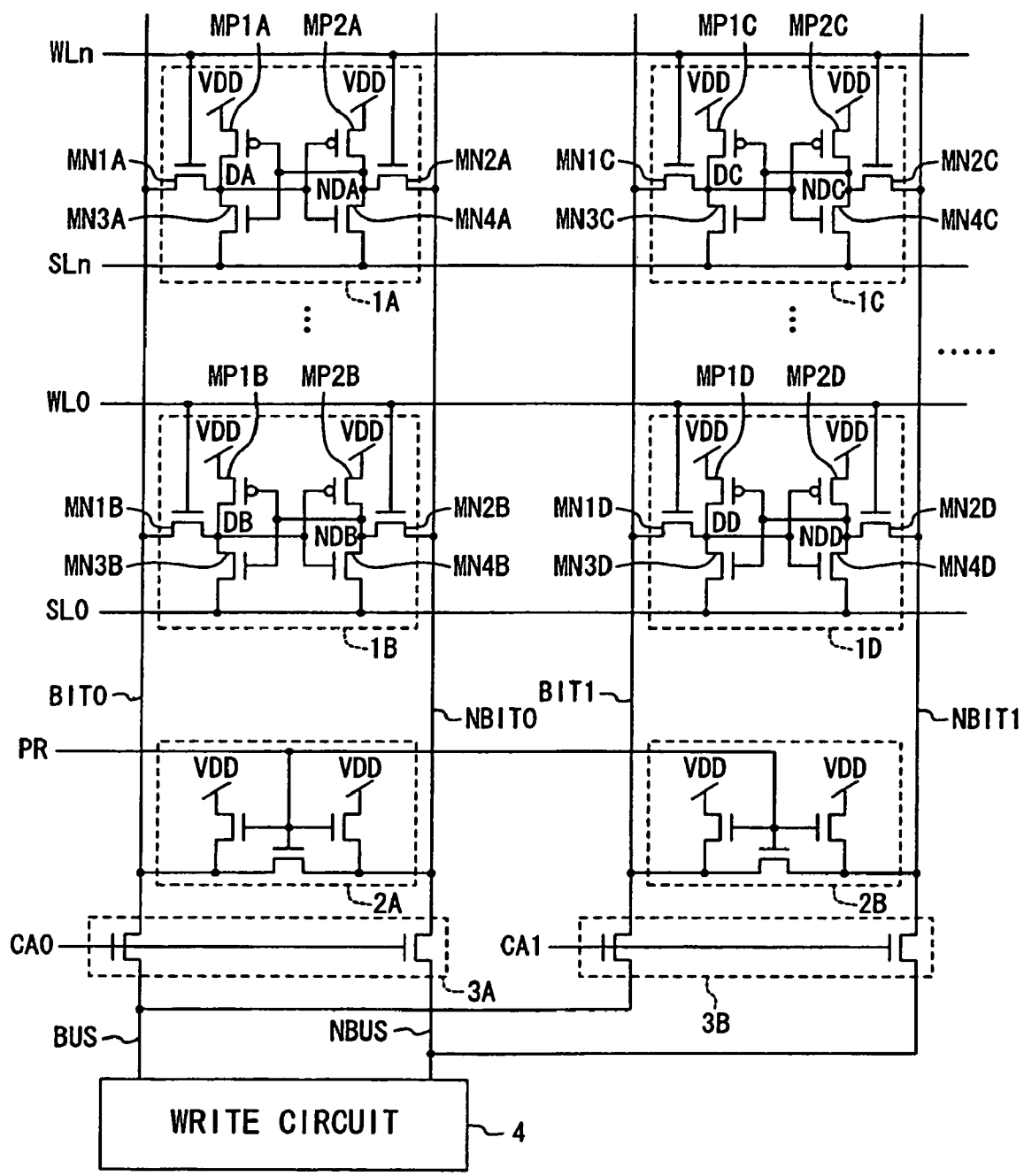
FIG. 8 illustrates a known semiconductor memory device obtained by improving the semiconductor memory device of FIG. 6.

Subsequently, it will be described how the semiconductor memory device of this embodiment operates. In this embodiment, a data write operation into the memory cell 1A will be described with reference to FIG. 5.

When data is written, the bit lines BIT0, NBIT0, BIT1 and NBIT1 have been beforehand precharged to the power supply voltage VDD by the precharge-equalize circuits 2A and 2B. The potential of the precharge signal PR becomes the ground potential VSS, and the precharge of the bit lines BIT0, NBIT0, BIT1 and NBIT1 is cleared.

Next, the potential of the column selector selection signal CA0 becomes the power supply potential VDD, and the write circuit 4 begins to reduce the potential of one of the selected bit lines BIT0 and NBIT0 to a potential VDD–$\Delta V$, which is smaller than the power supply potential VDD by a very small potential $\Delta V$.

Subsequently, the potential of the word line WLn becomes the power supply potential VDD, while at the same time the potential of the source line SL0 becomes the ground potential VSS. The assertion of the word line WLn and the negation of the source line SL0 do not depend upon the operating frequency, and are set for a given period of time. In this situation, the assertion transistor MN5A is not conducting, which allows the respective sources of the drive transistors MN3A and MN4A to float in the selected memory cell 1A. At this time, the potential of the source line SL1 is maintained at the power supply potential VDD, and in the unselected memory cells 1C through 1D, the respective sources of the drive transistors (MN3C, MN4C) through (MN3D, MN4D) are kept at the ground potential VSS. In the selected memory cell 1A, the transfer transistors MP3A and MP4A are brought into conduction, causing the potentials (whose difference is smaller than the potential $\Delta V$) of the selected bit lines BIT0 and NBIT0 to begin to be transferred to the storage nodes DA and NDA.

Then, the potential difference between the selected bit lines BIT0 and NBIT0 becomes the very small potential $\Delta V$, and the potential difference between the storage nodes DA and NDA in the selected memory cell 1A also becomes the very small potential $\Delta V$. At this point in time, the potential of the word line WLn is made to be the ground potential VSS, and thereafter the potential of the source line SL0 is raised to the power supply potential VDD. As a result, in the selected memory cell 1A, the transfer transistors MP3A and MP4A are brought out of conduction, while the source line SL0 has the power supply potential VDD to make the assertion transistor MN5A conductive, thereby causing the sources of the drive transistors MN3A and MN4A to have the ground potential VSS. Therefore, the potentials (VDD and VDD−ΔV) of the storage nodes DA and NDA are amplified to the power supply potential VDD and the ground potential VSS, respectively, and the data write into the memory cell 1A is completed.

When the data write operation has been completed, the potential of the column selector selection signal CA0 is made to be the ground potential VSS, while the precharge signal PR has the power supply potential VDD, and the potentials of the bit lines BIT0, NBIT0, BIT1 and NBIT1 are precharged and equalized to the power supply potential VDD.

During the data write operation, since the sources of the drive transistors MN3A and MN4A are allowed to float in the selected memory cell 1A, it is possible to write the reverse data, irrespective of the write margin, even when the power supply voltage VDD is a low voltage. In addition, one of the selected bit lines BIT0 and NBIT0 is amplified to only the potential (VDD−ΔV), which is smaller than the precharge potential VDD just by the very small potential ΔV, thus achieving a low power consumption as compared to a case of the full amplitude.

Further, in the unselected memory cell 1B disposed in the same column as the selected memory cell 1A, although conduction of the assertion transistor MN5A permits the sources of the drive transistors MN3B and MN4B to float, the transfer transistors MP3B and MP4B are not conducting, thereby permitting the data to be retained favorably. Moreover, in the unselected memory cell 1C disposed in the same row as the selected memory cell 1A, although the word line WLn brings the transfer transistors MP3C and MP4C into conduction, the assertion transistor MN5B is conducting so that the sources of the drive transistors MN3C and MN4C have the ground potential VSS, which permits the data to be retained favorably. Additionally, in transmitting the potential of the bit line to the selected memory cell 1A, the assertion of the word line WLn and the negation of the source line SL0 are not dependent upon the operating frequency, and are set during a given period of time. This effectively prevents data corruption caused by leakage and other factors, thereby ensuring stability in the data retention.

The foregoing has described the data write operation. In a data read operation, on the other hand, a positive potential is supplied to the substrates of the assertion transistors MN5A and MN5B. This results in a decrease in the threshold voltage of the assertion transistors MN5A and MN5B, leading to enhancement of the data readout speed.

What is claimed is:

1. A semiconductor memory device comprising:
a plurality of memory cells arranged in a memory array; and
a plurality of assertion transistors, each of the assertion transistors being provided for each of columns consisting of the memory cells in a bit line direction,
wherein each of the memory cells includes:
two load transistors, each of the load transistors having a source to which a first potential is supplied, and a gate which is connected to a drain of the other of the load transistors,
two transfer transistors, in which each of the transfer transistors has a source, drain and gate, and the both sources or drains of the transfer transistors are connected to a pair of bit lines, while the drains or sources that are not connected to the pair of bit lines are connected to the drains of the two load transistors, and the both gates of the transfer transistors are connected to a word line, and
two drive transistors, in which each of the drive transistors has a source, drain and gate, the both sources are connected together, the both drains are connected to the drains of the two load transistors, and the gate of each said drive transistor is connected to the drain of the other of said drive transistors,
wherein a drain of each of the assertion transistors is connected to the common source line for the drive transistors included in the memory cells located in each column, a source of each of the assertion transistors is supplied with a second potential which is different from the first potential,
wherein, during a data write operation in which a bit line pair is selected, only one common source line located in a row that corresponds to the selected bit line pair is allowed to float when the one word line is asserted, by controlling the assertion transistor provided for the column that corresponds to the selected bit line pair to be nonconductive, and
wherein, while the common source line for the drive transistors included in the memory cells located in one column is allowed to float, data is written into one of the memory cells by providing two bit lines of one pair with two different potentials whose difference is lower than a difference between the first potential and the second potential.

2. The device of claim 1, wherein the transfer transistors in each of the memory cells consist of N-type transistors, and
the bit line pair is made to operate at a potential in the vicinity of a third potential, which is a potential between the first and second potentials.

3. The device of claim 1, wherein the transfer transistors in each of the memory cells consist of P-type transistors, and
the bit line pair is made to operate at a potential in the vicinity of the first potential.

4. The device of claim 2, wherein the two bit lines of the pair are equalized to an identical potential by P-type transistors.

5. The device of claim 1, wherein during the data write operation into the memory cell, the word line is asserted only for a given period of time, while the sources of the drive transistors are made to float only for that given period of time.

6. The device of claim 1, wherein in a data readout operation from the memory cell, a potential supplied to the substrate of the assertion transistor is controlled to be a positive potential.

7. The device of claim 1, wherein, after data is written into one of the memory cells with the two different potentials while the common source line for the drive transistors included in the memory cells located in one column is allowed to float by controlling the assertion transistor in the column to be nonconductive, difference between the two different potentials is amplified by controlling the two transfer transistors in the column to be nonconductive and the assertion transistor in the column to be conductive.

* * * * *